(12) United States Patent
Walsh

(10) Patent No.: US 9,144,335 B2
(45) Date of Patent: Sep. 29, 2015

(54) SELF-POWERED LOGO CUP

(71) Applicant: Raymond James Walsh, Dallas, TX (US)

(72) Inventor: Raymond James Walsh, Dallas, TX (US)

( * ) Notice: Subject to any disclaimer, the term of this patent is extended or adjusted under 35 U.S.C. 154(b) by 0 days.

(21) Appl. No.: 14/584,530

(22) Filed: Dec. 29, 2014

(65) Prior Publication Data

US 2015/0182046 A1    Jul. 2, 2015

Related U.S. Application Data

(60) Provisional application No. 61/920,990, filed on Dec. 26, 2013.

(51) Int. Cl.
*A47G 19/22* (2006.01)
*F21V 33/00* (2006.01)

(52) U.S. Cl.
CPC ........ *A47G 19/2227* (2013.01); *F21V 33/0004* (2013.01); *A47G 2019/2238* (2013.01)

(58) Field of Classification Search
CPC ................................................. A47G 19/2227
See application file for complete search history.

(56) References Cited

U.S. PATENT DOCUMENTS

| 3,314,242 | A | 4/1967 | Peter |
| 3,808,825 | A | 5/1974 | Ciurea |
| 4,274,262 | A | 6/1981 | Reed et al. |
| 4,311,017 | A | 1/1982 | Reed et al. |
| 6,082,114 | A | 7/2000 | Leonoff |
| 8,541,958 | B2 | 9/2013 | Simon et al. |
| 8,550,288 | B2 | 10/2013 | Briar et al. |
| 2005/0084276 | A1 * | 4/2005 | Hirst et al. ..................... 399/81 |
| 2010/0157579 | A1 | 6/2010 | Kononuk |
| 2010/0182518 | A1 | 7/2010 | Kirmse et al. |
| 2012/0106130 | A1 | 5/2012 | Beaudette |
| 2013/0264951 | A1 | 10/2013 | Simon et al. |

FOREIGN PATENT DOCUMENTS

| CN | 203328428 U | 12/2013 |
| EP | 2225978 A1 | 9/2010 |
| EP | 2409615 A1 | 1/2012 |
| EP | 2409615 A1 * | 1/2012 |
| WO | WO2011119921 | 1/2012 |
| WO | WO 2013007798 | 1/2013 |

* cited by examiner

*Primary Examiner* — Mary Ellen Bowman
(74) *Attorney, Agent, or Firm* — Robert L. Shaver; Shaver & Swanson, LLP

(57) ABSTRACT

A vessel with powered display portion, powered by heat differential from a liquid in the vessel, and a thermoelectric generator. Heat from the liquid is used to generate electricity using a thermoelectric generator in thermal contact with the liquid, and a heat sink or radiator. Cold liquid in the vessel can also be used to generate electricity, by the difference in temperature outside the vessel. The powered display may be made of flexible material and can include LEDs, OLEDS, LCD, luminous tubing, fiber optics, or other light emitting structures.

11 Claims, 1 Drawing Sheet

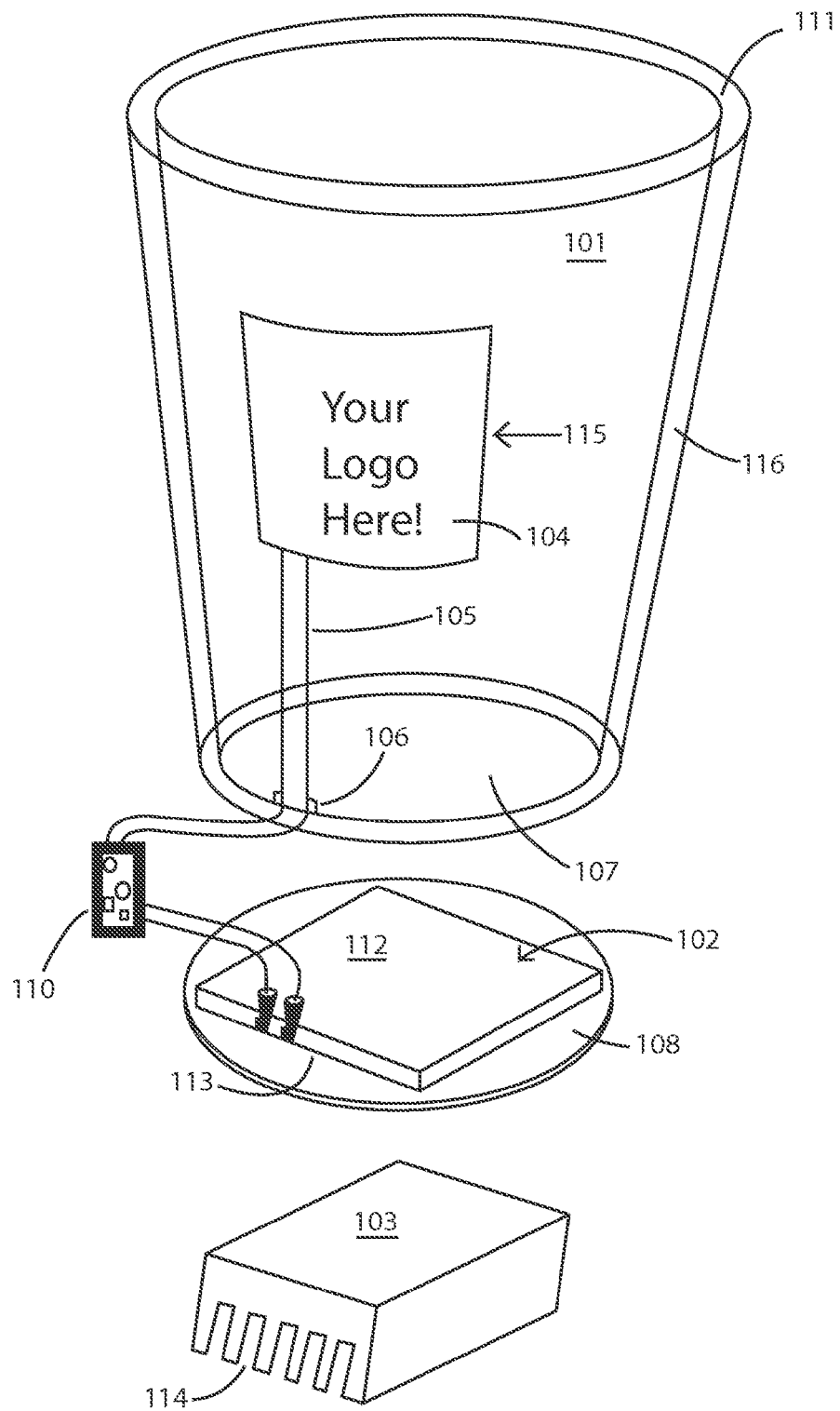

SELF-POWERED LOGO CUP

PRIORITY/CROSS-REFERENCE TO RELATED APPLICATIONS

This application claims the benefit of U.S. Provisional Application No. 61/920,990, filed Dec. 26, 2013, the disclosure of which is incorporated by reference.

TECHNICAL FIELD

The presently disclosed and claimed technology generally relates to beverage holding vessels, and more particularly to a vessel with a powered display.

BACKGROUND

There are a number of devices which provide an illuminated cup holder, typically in automobiles or theater seating, which aid in using the cup holder in low light situations. There are also various cups that bear a logo or utilize an illuminated or powered graphic, in which the illumination is typically an LED (light emitting diode) or backlit LCD (liquid crystal display) that is powered by a battery. There is a strong market for promotional materials for any particular brand, such as coffee, beer, tea, sports teams, cities, sporting equipment, and many other articles. Each of these entities produces products in which their insignia may be displayed. The products can be pennants, shot glasses, collectible spoons, enameled pins, travel mugs, coffee cups, can openers, decals, and many other articles. Sometimes these are given away or sold inexpensively as a memento of a trip.

A cup which is illuminated, or bears a powered graphic display, which does not require a battery would be very desirable in this product field. Having it be powered by solar power is one option, but solar power is only available when the product is in the sunshine. A novel way of powering the display would be to use the heat or cold from the product itself, such as heat from a hot cup of coffee or the chill of an ice-cold beer, to power the display. The display could be a logo, an interesting phrase, the trademark of a sports team or a company, or other graphics which are typically used in promotional products.

SUMMARY OF THE DISCLOSURE

The purpose of the Abstract is to enable the public, and especially the scientists, engineers, and practitioners in the art who are not familiar with patent or legal terms or phraseology, to determine quickly from a cursory inspection, the nature and essence of the technical disclosure of the application. The Abstract is neither intended to define the inventive concept(s) of the application, which is measured by the claims, nor is it intended to be limiting as to the scope of the inventive concept(s) in any way.

The disclosed self-powered logo cup is a vessel with a powered display, and can operate using either hot or cold beverages or food. It uses the temperature difference between the beverage and the environment to generate electricity using a thermoelectric generator (TEG). The electricity generated passes through an optional DC to DC voltage step up, and is then used to power a light emitting diode LED, organic light emitting diode OLED, flexible organic light emitting diode (OLED) or other light producing unit (such as luminous tubing or light transmitting fibers) in the wall of the cup that bears an image, such as a business logo, sports team logo, words, phrase, geographic designation, or other graphic image. The thermoelectric device can be sandwiched between the cup and a heat sink for more efficient heat transfer. The heat sink is optional, as is a heat radiator. A second embodiment is identical to the first except instead of having an LED the cup has an LCD or other electrically powered device bearing a message or logo. The intention is that the electricity generated from the TEG would illuminate or power some design, logo, trademark, word, phrase, or other artistic representation, or visually convey status information about the temperature in the cup, quantitatively or qualitatively. Another embodiment transitions from one color while hot to another when cold. One embodiment might show a digital indicator of temperature, another might show an analog indicator of temperature such as a series of sequentialing blinking LED's that blink faster the more heat is generated.

Still other features and advantages of the presently disclosed and claimed inventive concept(s) will become readily apparent to those skilled in this art from the following detailed description describing preferred embodiments of the inventive concept(s), simply by way of illustration of the best mode contemplated by carrying out the inventive concept(s). As will be realized, the inventive concept(s) is capable of modification in various obvious respects all without departing from the inventive concept(s). Accordingly, the drawings and description of the preferred embodiments are to be regarded as illustrative in nature, and not as restrictive in nature.

BRIEF DESCRIPTION OF THE DRAWINGS

FIG. 1 is an exploded perspective view of a powered vessel of the disclosed technology.

DETAILED DESCRIPTION OF THE EXEMPLARY EMBODIMENTS

While the presently disclosed inventive concept(s) is susceptible of various modifications and alternative constructions, certain illustrated embodiments thereof have been shown in the drawings and will be described below in detail. It should be understood, however, that there is no intention to limit the inventive concept(s) to the specific form disclosed, but, on the contrary, the presently disclosed and claimed inventive concept(s) is to cover all modifications, alternative constructions, and equivalents falling within the spirit and scope of the inventive concept(s) as defined in the claims.

A preferred embodiment of the disclosed technology is shown FIG. 1. FIG. 1 is an exploded perspective view of one embodiment of the represents an expanded depiction of the self-powered logo cup. Liquid containment vessel 101 has a powered display 115 energized by electricity. The vessel 101 has a top edge 111, a bottom side 107, and a circumvolving sidewall 116 which connects the top edge and the bottom side. Vessel 101 would typical be made of plastic or metal, and may be double walled to reduce radiation of heat through the sidewall. Electrical connection 105 is typically wires, and connect display 115 electrically to junction 106 which connects electrically to voltage stepper 110, which can include hot-cold selection functions. Voltage stepper 110 receives electrical current from thermoelectric device 102 which is attached to base 108. The TEG has a first side 112 in direct physical contact with bottom of vessel 107, which may be a heat transfer plate 107, which allows heat to flow to or from liquid in cup 101. The bottom of cup 101 comprises a heat transfer plate 107 and is in direct contact with the liquid in cup 101 on one side and the first side of the TEG 102 on the other side. The TEG 102 has a second side 113, which is in direct physical contact with heat sink 103. Heat sink 103 can include a radiator 114. Both surfaces of TEG 102 may be bonded with silver epoxy or other means of bonding that allows for heat transfer.

The TEG 102 used can be any model of available TEG, with a TEG made by VKTech, model number TEC1-12706, of 40 mm by 40 mm being one example.

The powered display 115 can include a combination of printed or LCD graphics, and lighted portion, with the lighted portions being LEDs 104, OLEDs, flexible OLEDs, luminous tubing, or fiber optics displays.

The three essential components include the containment vessel 101, the thermoelectric generator 102, and the powered display 115. Greater efficiency is had by insulating the containment vessel with a double wall or other means. The device as a whole will operate briefly without heat sink 103 which also serves as a heat dissipator or radiator. Electricity is produced by the flow of heat, which occurs only there is a difference in temperature between one side of the thermoelectric generator and the other.

A DC to DC voltage stepper or booster 110 has been beneficial in the function of the device. Many off the shelf LED's require a minimum voltage of 2.5 volts while some thermoelectric generators produce less than 0.5 volts for the temperature differences of 100 degrees F. or less. The DC booster helps in situations where there is voltage mismatch.

While certain exemplary embodiments are shown in the figures and described in this disclosure, it is to be distinctly understood that the presently disclosed inventive concept(s) is not limited thereto but may be variously embodied to practice within the scope of the following claims. From the foregoing description, it will be apparent that various changes may be made without departing from the spirit and scope of the disclosure as defined by the following claims.

I claim:

1. A vessel with a powered display, comprising:
a vessel for containing a liquid, said vessel having a top edge and a bottom side, connected by a circumvolving sidewall;
a powered display positioned on said sidewall of said vessel;
a thermoelectric generator with a first side in contact with said vessel, and a second side, said thermoelectric generator configured to continuously generate electricity based on the continuous flow of thermal energy through said thermoelectric generator;
a heat sink in thermal contact with said second side of said thermoelectric generator; and
an electrical connection between said thermoelectric generator and said powered display;
wherein said thermoelectric generator is configured to create a continuous electric current from the continuous passage of thermal energy through the thermoelectric generator.

2. The vessel with a powered display of claim 1 which further comprises a DC to DC voltage step converter in said electrical connection for matching the power requirements of said powered display with power generated from said thermoelectric generator.

3. The vessel with a powered display of claim 1 which further comprises a hot-cold switch in said electrical connection for selecting use with a hot beverage or a cold beverage.

4. The vessel with a powered display of claim 1 in which said powered display is comprised of one or more LEDs.

5. The vessel with a powered display of claim 1 in which said powered display is comprised of one or more liquid crystal displays.

6. The vessel with a powered display of claim 1 in which said powered display is comprised of flexible material.

7. The vessel with a powered display of claim 1 in which said powered display comprises of one or more organic light emitting diodes.

8. The vessel of claim 7 in which the organic light emitting diode is flexible.

9. A vessel with a light producing image, comprising:
a vessel for containing a liquid, said vessel having a top edge and a bottom side, connected by a circumvolving sidewall;
a powered display positioned on said sidewall of said vessel comprised of one or more LEDs;
a thermoelectric generator with a first side in contact with said bottom side of said vessel and a second side, said thermoelectric generator configured to continuously generate electricity based on the flow of thermal energy through said thermoelectric generator;
a heat sink in thermal contact with said second side of said thermoelectric generator;
an electrical connection between said thermoelectric generator and said powered display; and
wherein said thermoelectric generator is configured to create a continuous electric current from the temperature differential from the first side of said thermoelectric generator, and the temperature on the second side of the thermoelectric generator.

10. The vessel with a light producing image of claim 9 in which the light producing image comprises a flexible organic light emitting diode.

11. A vessel with a light producing image, comprising:
a vessel for containing a liquid, said vessel having a top edge and a bottom side, connected by a circumvolving sidewall;
a lighted display positioned on said sidewall of said vessel;
a thermoelectric generator with a first side in contact with said bottom side of said vessel, and a second side, said thermoelectric generator configured to generate electricity based on a temperature differential from said first side to said second side;
an electrical connection between said thermoelectric generator and said lighted display;
a voltage stepper in said electrical connection for matching voltage and amperage requirements of said lighted display from power produced by said thermoelectric generator; and
a heat sink in thermal contact with said second side of said thermoelectric generator;
wherein said thermoelectric generator is configured to create an electric current from the temperature differential from the first side of said thermoelectric generator to the temperature on the second side of the thermoelectric generator.

* * * * *